(12) United States Patent
Bednarcik et al.

(10) Patent No.: US 9,066,450 B2
(45) Date of Patent: Jun. 23, 2015

(54) DATA CENTER AIR ROUTING SYSTEM

(75) Inventors: Edward Bednarcik, East Greenwich, RI (US); Michael Tresh, Haverhill, MA (US); Brian Jackson, Waltham, MA (US)

(73) Assignee: WRIGHT LINE, LLC, Worcester, MA (US)

( * ) Notice: Subject to any disclaimer, the term of this patent is extended or adjusted under 35 U.S.C. 154(b) by 1179 days.

(21) Appl. No.: 12/605,992

(22) Filed: Oct. 26, 2009

(65) Prior Publication Data

US 2010/0144265 A1 Jun. 10, 2010

Related U.S. Application Data

(60) Provisional application No. 61/108,066, filed on Oct. 24, 2008.

(51) Int. Cl.
*F25D 23/12* (2006.01)
*H05K 7/20* (2006.01)

(52) U.S. Cl.
CPC .................................. *H05K 7/20745* (2013.01)

(58) Field of Classification Search
USPC ............. 454/184; 361/690, 695; 52/79.1, 578
See application file for complete search history.

(56) References Cited

U.S. PATENT DOCUMENTS

| | | | |
|---|---|---|---|
| 6,034,873 A * | 3/2000 | Ståhl et al. | 361/701 |
| 7,173,820 B2 * | 2/2007 | Fink et al. | 361/679.48 |
| 7,430,118 B1 | 9/2008 | Noteboom et al. | |
| 7,477,514 B2 * | 1/2009 | Campbell et al. | 361/699 |
| 7,867,070 B2 * | 1/2011 | Day | 454/184 |
| 8,523,643 B1 * | 9/2013 | Roy | 454/184 |
| 2006/0260338 A1 | 11/2006 | VanGilder et al. | |
| 2007/0064389 A1 | 3/2007 | Lewis, II et al. | |
| 2008/0305733 A1 | 12/2008 | Noteboom et al. | |
| 2009/0046427 A1 | 2/2009 | Noteboom et al. | |
| 2009/0239460 A1 | 9/2009 | Lucia et al. | |

OTHER PUBLICATIONS

International Search Report for co-pending PCT Application No. PCT/US2010/053661.
Written Opinion of the International Searching Authority for co-pending PCT Application No. PCT/US2010/053661.

* cited by examiner

*Primary Examiner* — Steven B McAllister
*Assistant Examiner* — Samantha Miller
(74) *Attorney, Agent, or Firm* — Squire Patton Boggs (US) LLP

(57) ABSTRACT

The invention provides a modular, configurable aisle isolation and containment system that may function as a hot aisle or as a cold aisle. The data center air routing system of the invention comprises one or more free-standing, essentially identical, modular system units. Each modular unit comprises two sidewalls, a ceiling, and a door or panel at either end to form an interior, enclosed aisle. Two or modular units may be coupled together end-to-end. Each modular unit further comprises one or more sidewall blanking panels that may be removed to create gaps of varying height and width to accommodate one or more IT racks. Each modular unit may also include one or more ceiling-mounted air ducts, baffles and fans to manage air flow.

19 Claims, 17 Drawing Sheets

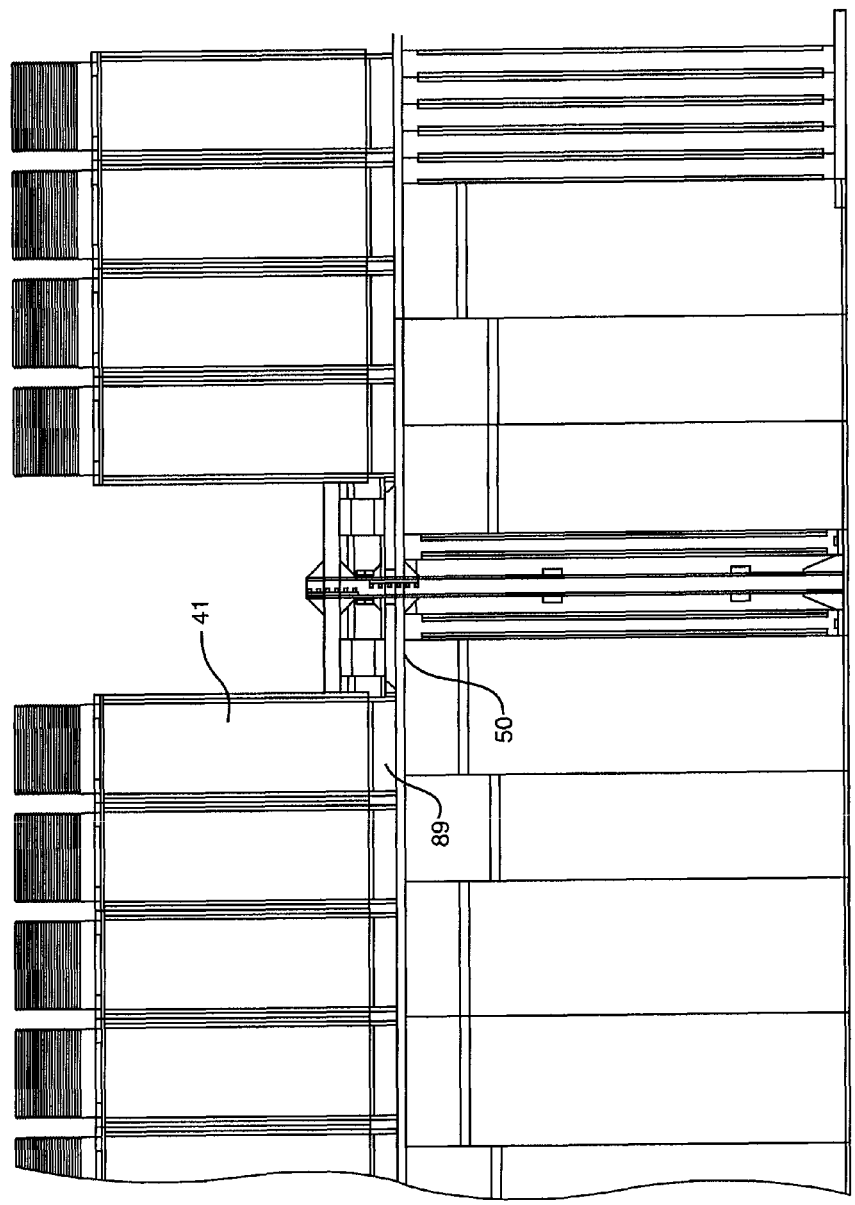

DATA CENTER AIR ROUTING SYSTEM

CROSS-REFERENCE TO RELATED APPLICATIONS

This application claims priority to U.S. Provisional Patent Application Ser. No. 61/108,066, entitled "Data Center Air Routing System," filed on Oct. 24, 2008, the entire contents of which are expressly incorporated by reference herein.

FIELD OF THE INVENTION

The invention relates generally to the field of data center airflow and temperature management. Specifically, the invention combines elements of both heat containment and cold air isolation systems to create a modular, configurable aisle isolation and containment system that applies to either hot or cold aisles and also to the combination of both.

BACKGROUND OF THE INVENTION

Companies that house data center rooms are faced with difficult challenges in providing the proper thermal environment for information technology (IT) equipment. IT equipment must operate under specific temperature ranges and data center rooms must be able to accommodate those ranges. Providing the appropriate temperature in a data center room may include using precision air conditioning for cooling, arranging the IT equipment into hot aisle/cold aisle configurations and allowing the hot air to flow freely to the return of the precision air conditioner. With higher levels of computing load, however, the ability to prevent hot and cold air from premixing is critical to the IT equipment's operability and the data center's overall efficiency. Proven methodologies to prevent cold air supply and hot air return from contaminating each other are required. An issue of particular importance that must be overcome with any air isolation method is being able to adjust to accommodate the wide range of equipment sizes and shapes. Compounding the problem, when data centers add new and different equipment the performance and efficiency of the original cooling infrastructure is impacted. New racks may not fit in the same footprint or have the same cooling needs. Implementing these moves, additions and changes is therefore difficult without a flexible system designed to meet these challenges.

Resource demands and constraints, including those related to power, represent a critical concern in the United States today. The increasing demand, and strain, placed upon electrical grids across the United States by data centers of all sizes is a material contributor to this issue.

The United States Environmental Protection Agency (EPA) addressed this issue in August 2007 and submitted a report to the United States Congress as part of public law to help define a vision for achieving energy efficiencies in data centers. The EPA predicts that by 2011, 2% of the United State's entire energy supply will be consumed by data centers.

Currently, data center managers are focused on the delivery of service and dependability. There has been little incentive, however, for data center managers to optimize the energy efficiency of their data center. In addition, the industry has not set any proper benchmarks for attainable energy efficiency targets, which further complicates the situation. Data center managers are primarily concerned about capital costs related to their data center's capacity and reliability. In most cases the energy costs are either hidden among other operating costs or simply absorbed as a cost of doing business. A study by the company IDC Global shows that for every $1.00 US of new server spend in 2005, $0.48 US was spent on power and cooling. This is a sharp increase from the year 2000, when the ratio was $0.21 US per $1.00 US of server spend. This ratio is anticipated to increase even further. It is expected, then, that the immediate demand to create more efficient data centers will be at the forefront of most company's cost saving initiatives.

Prior art legacy data centers typically have the following characteristics:

(1) An open air system that delivers cold air at approximately 55 degrees Fahrenheit (approximately 13 degrees Celsius) via overhead ducting, flooded room supply air, or a raised floor plenum;

(2) Perforated tiles (in a raised floor environment) that are used to channel the cold air from beneath the raised floor plenum into the data center;

(3) Computer racks, server enclosures and free-standing equipment orientated 180 degrees from alternate rows to create hot and cold aisles, which is an accepted best practice. Historically, however, information technology (IT) architecture has been the driving force in deciding the location of the racks and other equipment, leading to a disorganized and inefficient approach to air distribution;

(4) Computer racks, server enclosures and free-standing equipment that vary in size and shape;

(5) A minimum separation of 4 feet (approximately 1.22 meters) between cold aisles and 3 feet (approximately 0.91 meters) between hot aisles, based on recommendations from the American National Standards Institute (ANSI/TIA/EIA-942 April 2005), National Fire Protection Association (NFPA), National Electric Code (NEC), and local Authority Having Jurisdiction (AHJ);

(6) Dedicated precision air conditioning units located at the nearest perimeter wall and generally in close proximity to IT racks. However, optimal placement of the computer room air conditioner (CRAC) for free air movement is biased by structural columns, and often requires service clearances or other infrastructure accommodations;

(7) Traditional air conditioning systems are "turned on" on day one, and remain at full capability for cooling, even if only a small percentage of the design load is required; and (8) Existing air conditioning systems have limitations and are sensitive to the location of heat loads in and around the data center, and therefore are not resilient to changing configurations and requirements.

In practice, the airflow in the legacy data center is very unpredictable, and has numerous inefficiencies, which are proliferated as power densities increase. Problems encountered in a data center include: bypass airflow, recirculation, hot and cold air remixing, air stratification, air stagnation, and uncomfortable data center ambient room temperature.

Bypass Airflow

Bypass airflow is defined as conditioned air that does not reach computer equipment. The most common form of bypass airflow occurs when air supplied from the precision air conditioning units is returned directly back to the air conditioner's intake. Examples of this form of bypass airflow may include leakage areas such as air penetrating through cable cut-outs, holes under cabinets, or misplaced perforated tiles that blow air directly back to the air conditioner's intake. Other examples of bypass airflow include air that escapes through holes in the computer room perimeter walls and non-sealed doors.

A recent study completed by engineers from UpSite Technologies, Inc.™ and Uptime Institute, Inc.® concluded that in conventional legacy data centers only 40% of the air delivered from precision air conditioning units makes its way to cool the existing information technology (IT) equipment. This amounts to a tremendous waste in energy, as well as an excessive and unnecessary operational expense.

Recirculation

Recirculation occurs when the hot air exhausted from a computing device, typically mounted in a rack or cabinet, is fed back into its own intake or the intake of a different computing device. Recirculation principally occurs in servers located at the highest points of a high-density rack enclosure. Recirculation can result in potential overheating and damage to computing equipment, which may cause disruption to mission-critical services in the data center.

Hot and Cold Air Remixing and Air Stratification

Air stratification in a data center is defined as the layering effect of temperature gradients from the bottom to the top of the rack or cabinet enclosure.

In general, in a raised floor environment, air is delivered at approximately 55 degrees Fahrenheit (approximately 13 degrees Celsius) from under the raised floor through perforated tiles. The temperature of the air as it penetrates the perforated tile remains the same as the supply temperature. As the air moves vertically up the rack however, the air temperatures gradually increase. In high-density rack enclosures it is not uncommon for temperatures to exceed 90 degrees Fahrenheit (approximately 32 degrees Celsius) at the server intakes mounted at the highest point of the rack enclosure. The recommended temperature range however, for server intakes, as stated by ASHRAE Technical Committee 9.9 Mission Critical Facilities, is between 68 and 77 degrees Fahrenheit (approximately 20 to 25 degrees Celsius).

Thus, in a legacy data center design, the computer room is overcooled by sending extremely cold air under the raised floor, simply because there is a lack of temperature control as the air moves upward through the rack or cabinet enclosure.

In addition, because the hot air and the cold air are not isolated, and tend to mix, dedicated air conditioning units are typically located close to the rack enclosures, which may not be the most efficient or economical placement. In some situations, the most efficient or economical solution may be to use the building's air conditioning system, rather than having air conditioning units that are dedicated to the data center, or a combination of dedicated air conditioning units and the building's air conditioning system.

Air Stagnation

Large data centers typically have areas where the air does not flow naturally. As a result, the available cooling cannot be delivered to the computing equipment. In practice, data centers may take measures to generate air flow in these areas by utilizing air scoops, directional vanes, oscillating floor fans, and active fan-based floor tiles.

Uncomfortable Data Center Ambient Room Temperature

Data center ambient room temperature is not conditioned to comfortable working conditions. The ambient air temperature in a data center is typically determined by inefficiencies between providing cool air and removing heated air.

To address some of these concerns, data centers may be equipped with in-row air conditioning units, either in place of, or to supplement, larger computer-room air conditioners. These in-row cooling units extract hot air from the room or the hot aisle and return cooled air to the cold aisle. A particular in-row air conditioning unit, however, is constrained by its location, in that it may only be used to cool the equipment in the row in which it is located. An in-row air conditioning unit's excess cooling capacity cannot be used to cool equipment racks in a different row. In addition, an in-row air conditioning unit does nothing to reduce the temperature in the hot aisle, and in some cases, may actually increase the temperature in the hot aisle beyond recommended safety limits.

There is a need in the art, then, for improved systems and methods for containing the air in both hot and cold aisles in data centers. In particular, there is a need to remedy the typical problems encountered in a data center, including the problems created by moves, additions and changes to IT equipment, as well as problems created by air flow inefficiencies such as bypass airflow, recirculation, hot and cold air remixing, air stagnation, and the like. This improved system would create a flexible aisle isolation and containment system designed to meet these challenges.

SUMMARY OF THE INVENTION

The invention provides reliable, dependable management of conditioned or exhausted air, and delivers and/or disposes of the air to address the previously-described air management issues.

The data center air routing system of the invention may comprise one or more free-standing, essentially identical, modular system units. Two or more modular system units may be coupled together with a connector structure. Each modular system unit comprises two sidewalls, a ceiling, and a door or panel at either end, thus forming an interior, enclosed aisle. When two or more modular system units are coupled together end-to-end, the doors or panels at the mating ends may be removed to form a longer, enclosed aisle, forming an interior opening that extends from one end of the data center air routing system to the other.

Each modular system unit further comprises one or more removable sidewall blanking panels. One or more blanking panels may be removed, thus creating gaps of varying height and width, to accommodate one or more IT racks. The sidewall blanking panels may be transparent or translucent, to allow ambient light into the interior aisle, or opaque, to inhibit ambient light from penetrating into the interior aisle of the data center air routing system, or any combination thereof.

Each modular system unit further comprises a ceiling having one or more optionally removable ceiling panels. The ceiling panels may be transparent or translucent, to allow ambient light into the interior aisle, or opaque, to inhibit ambient light from penetrating into the interior aisle of the data center air routing system, or any combination thereof.

Each modular system unit further comprises one or more ceiling air delivery/exhaust assemblies, and each ceiling air delivery/exhaust assembly comprises one or more air ducts. The air ducts may comprise flexible tubing to couple the air ducts to a suspended or drop ceiling. The air ducts are further coupled to the modular system unit ceiling, to facilitate air flow into or out of the data center air cooling system. The ducts may also comprise sidewalls. The duct sidewalls may be transparent or translucent, to allow ambient light into the interior aisle, or opaque, to inhibit ambient light from penetrating into the interior aisle of the data center air routing system, or any combination thereof.

The data center air cooling system may function as a cold aisle or a hot aisle, depending upon whether the front or rear sides of the IT racks are coupled to the sidewalls of the modular system unit. The IT racks are coupled to the modular system unit by removing one or more sidewall blanking panels, and installing adjustable blanking panels and side-sealing panels to fill in any gaps between the IT racks and the modular system unit sidewalls.

In an embodiment, the data center air routing system of the invention comprises a free-standing structure comprising a frame that defines the edges of two sidewalls, a ceiling and two ends that together define an interior aisle, where the sidewalls comprise a plurality of full-height sidewall blanking panels that are removably coupled at their upper and lower ends to the frame and are releasably coupled to each other, so as to allow one or more IT racks to be coupled to either side of the structure, to route air between the structure and the IT racks; one or more adjustable blanking panels sized and shaped to fill the space between a top panel of the one or more IT racks and a top edge of the frame; where the structure is relatively air-tight, to prevent unwanted air from infiltrating or escaping the interior of the structure; and a door located at one or both ends, to allow personnel access to the interior aisle, and inhibit unwanted air flow.

In an aspect, the frame is generally rectangular and comprises four vertical support posts located at each corner of the structure, two upper horizontal members and two lower horizontal members, each horizontal member coupled to two of the vertical support posts, and where the sidewall blanking panels are removably coupled to at least one of the lower horizontal members and at least one of the upper horizontal members.

In another aspect, the lower and upper horizontal members each define a plurality of slots, and the sidewall blanking panels each define an upper protruding tab adapted to fit into one of the slots in one of the upper horizontal members and a lower protruding tab adapted to fit into one of the slots in one of the lower horizontal members. In yet another aspect, the frame further comprises one or more upper cross members, where each end of the upper cross member is coupled to one of the upper horizontal members.

In an aspect, the data center air routing system of the invention further comprises at least one baffle frame comprising one or more baffles, and wherein the baffle frame is adapted to removably couple to at least one of the upper cross members.

In another aspect, the ceiling comprises removable panels. In yet another aspect, the removable ceiling panels are configured to interlock with an adjacent ceiling panel.

In an aspect, the data center air routing system of the invention further comprises an air delivery/exhaust assembly that can be coupled to the structure in place of one or more removed ceiling panels. In another aspect, the data center air routing system of the invention further comprises one or more baffles located between the air delivery/exhaust assembly and the interior aisle. In yet another aspect, at least some of the ceiling panels are transparent or translucent. In still another aspect, at least some of the sidewall blanking panels are transparent or translucent.

In an aspect, the data center air routing system of the invention further comprises one or more side-sealing panels sized and shaped to fill the space between the sides of the one or more IT racks and the adjacent sidewall blanking panel. In another aspect, the left and right sides of each of the sidewall blanking panels define a side flange adapted to allow each of the sidewall blanking panels to interlock with an adjacent sidewall blanking panel. In still another aspect, the data center air routing system of the invention further comprises one or more cable trays.

In another embodiment, the data center air routing system of the invention comprises a free-standing structure comprising a generally rectangular frame that defines the edges of two sidewalls, a ceiling, and two ends that together define an interior aisle; where the frame comprises four vertical support posts located at each corner of the structure, and two upper horizontal members and two lower horizontal members, each horizontal member coupled to two of the vertical support posts; one or more sidewall blanking panels removably coupled to at least one of the upper horizontal members and one of the lower horizontal members and releasably coupled to each other, so as to allow one more IT racks to be coupled to either side of the structure; where the left and right sides of each of the sidewall blanking panels define a side flange adapted to allow each of the sidewall blanking panels to interlock with an adjacent sidewall blanking panel; one or more adjustable blanking panels sized and shaped to fill the space between a top panel of the one or more IT racks and a top edge of the frame; and one or more side-sealing panels sized and shaped to fill the space between the sides of the one or more IT racks and the adjacent sidewall blanking panel.

In an aspect, the lower and upper horizontal members each define a plurality of slots, and the sidewall blanking panels each define an upper protruding tab adapted to fit into one of the slots in the upper horizontal member and a lower protruding tab adapted to fit into one of the slots in the lower horizontal member. In another aspect, the ceiling comprises one or more removable panels.

In an aspect, the data center air routing system of the invention further comprises one or more air delivery/exhaust assemblies. In another aspect, the data center air routing system of the invention further comprises one or more baffles. In still another aspect, the data center air routing system of the invention further comprises one or more cable trays.

In another embodiment, the data center air routing system of the invention comprises two or more free-standing structures, each structure comprising a frame that defines the edges of two sidewalls, a ceiling and two ends that together define an interior space, where the sidewalls comprise a plurality of full-height sidewall blanking panels that are removably coupled at their upper and lower ends to the frame and releasably coupled to each other, so as to allow one or more IT racks to be coupled to either side of the structure, to route air between the structure and the IT racks; one or more adjustable blanking panels sized and shaped to fill the space between a top panel of the one or more IT racks and a top edge of the frame; and one or more side-sealing panels sized and shaped to fill the space between the sides of the one or more IT racks and the adjacent sidewall blanking panel; where the interior spaces of each of the structures are open to each other to form an interior aisle that extends through the length of both structures; and where the system is relatively air-tight, to prevent unwanted air from infiltrating or escaping the interior of the system.

In an aspect, the data center air routing system of the invention further comprises a door located at one or both ends of the interior aisle, to allow personnel access to the interior aisle, and inhibit unwanted air flow. In another aspect, each of the frames is generally rectangular and comprises four vertical support posts located at each corner of the structure, two upper horizontal members and two lower horizontal members, each horizontal member coupled to two of the vertical support posts, and where the sidewall blanking panels are removably coupled to at least one of the lower horizontal members and at least one of the upper horizontal members.

In another aspect, the lower and upper horizontal members each define a plurality of slots, and the sidewall blanking panels each define an upper protruding tab adapted to fit into one of the slots in one of the upper horizontal members and a lower protruding tab adapted to fit into one of the slots in one of the lower horizontal members. In still another aspect, each of the frames further comprise one or more upper cross members, where each end of the upper cross member is coupled to one of the upper horizontal members.

Embodiments of the invention may provide a number of advantages, including:

Airflow Management—accommodates a wide range of IT equipment and facilitates cold air delivery and hot air removal.

Passive Airflow Management—does not require additional active components to manage airflow.

Active Airflow Management—can be adapted to add active cooling equipment on either the intake side or the exhaust side of the electronic device.

Reversible Application—can be installed over either the hot aisle or the cold aisle.

Adjustable Application—can be installed to allow for front-justified or rear-justified IT enclosures and equipment.

Modular Application—can be installed with or without various features and settings as well as in multiple arrangements and configurations.

Space/Size Adaptability—can be adapted for use with electronic equipment in a range of sizes and heights.

Material Selection—can be constructed in multiple materials to meet different cost and environment requirements.

Management and Monitoring—can include instrumentation and devices to facilitate the reporting and operation to meet user performance criteria.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 5A, 5B and 5C are cross-sectional views of data center air routing systems, showing three different embodiments of air movement systems that may be incorporated into the data center air routing systems of the invention;

DETAILED DESCRIPTION OF THE PREFERRED EMBODIMENTS OF THE INVENTION

Figure 1:
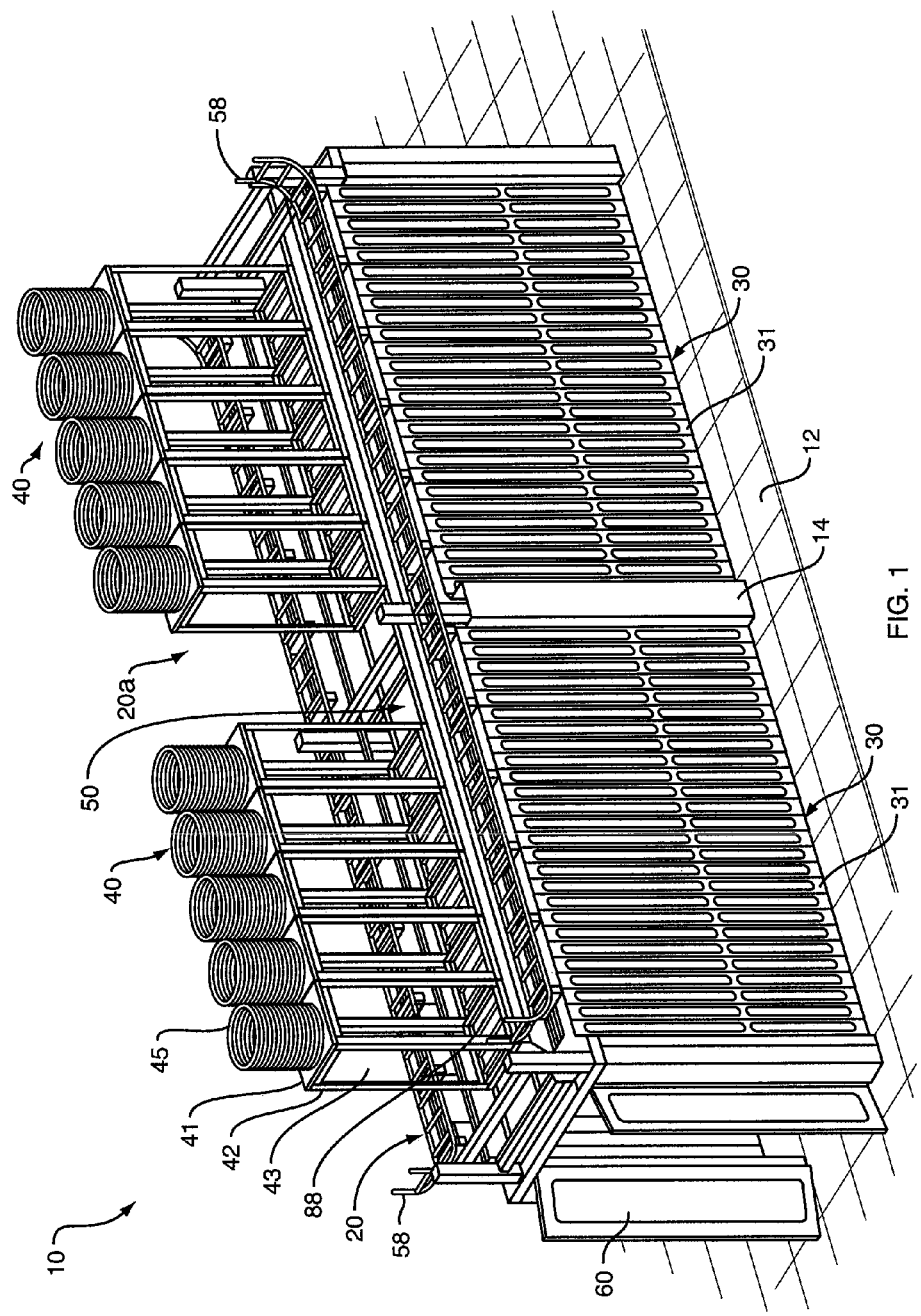
FIG. 1 is a perspective view a data center air routing system, in accordance with a preferred embodiment of the invention, comprising two mated modular system units, sidewall blanking panels that allow ambient light into the aisles of the modular system units, doors at each end of the data center air routing system, and ceiling air delivery/exhaust assemblies with duct sidewalls that allow ambient light into the aisles of the modular system units.
Figure 2:
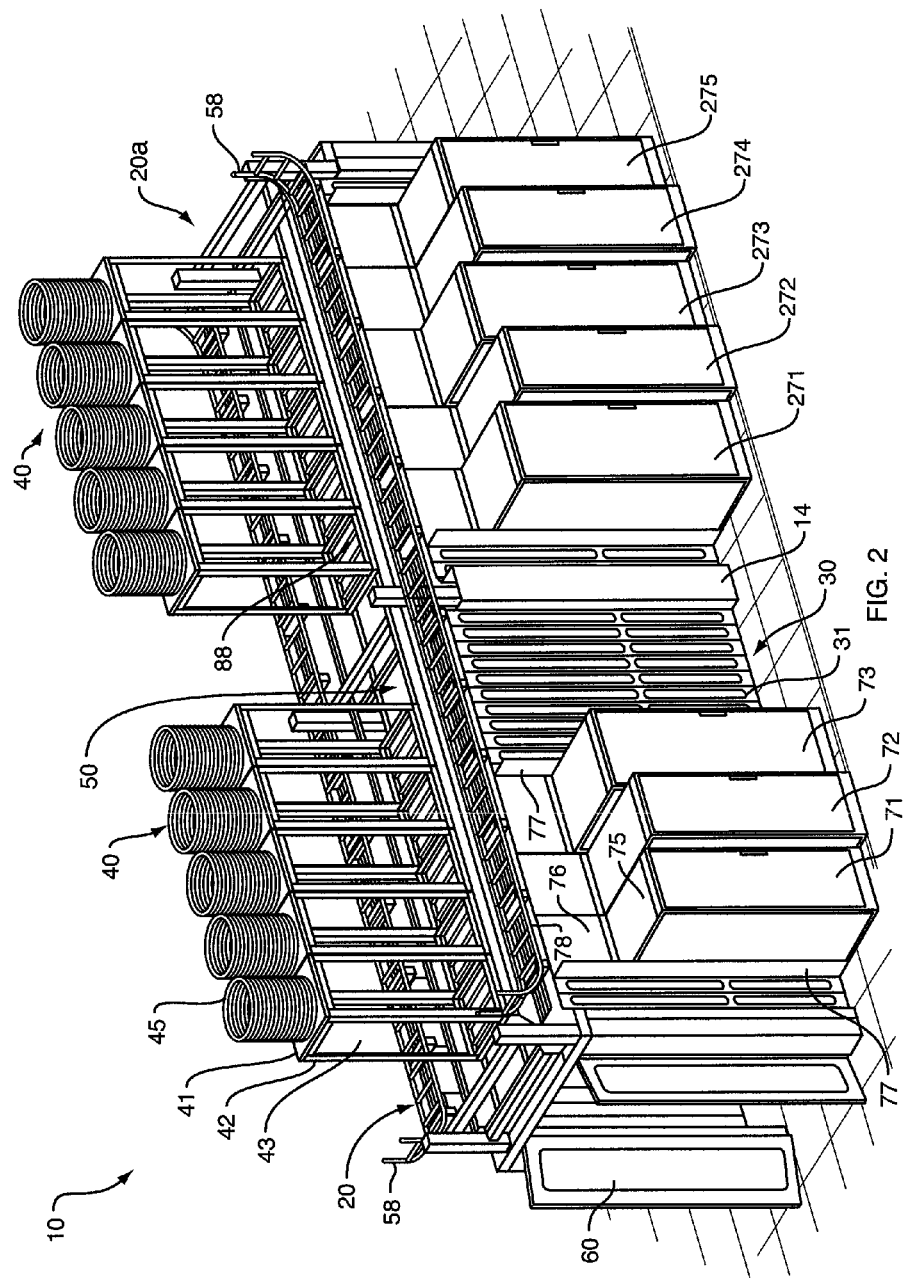
FIG. 2 is a perspective view of the data center air routing system of FIG. 1, showing the addition of IT racks coupled to the modular system units in place of one or more of the blanking panels.

In a preferred embodiment, and as shown in FIGS. 1 and 2, data center air routing system 10 comprises two free-standing, essentially identical, modular system units 20 and 20a. Note that in alternate embodiments, the data center air routing system of the invention may comprise only one modular system unit, or may comprise more than two free-standing, essentially identical, modular system units, which may be coupled end-to-end.

With further reference to FIGS. 1 and 2, modular system units 20 and 20a are preferably coupled together by connector structure 14, described below. Each modular system unit 20 (and 20a) is a generally rectangular, free-standing structure comprising two essentially identical sidewalls, such as sidewall 30, a ceiling 50, and two doors 60, one at either end of the modular system unit, thus forming an interior, enclosed aisle. While modular system unit 20 may further comprise an optional floor, in a preferred embodiment the modular system unit is configured to sit on the floor of the data center room in which it is located.

Note that in alternate embodiments, one of the doors may be replaced with a removable panel. When two or more such modular system units, such as modular system units 20 and 20a, are coupled together, as shown in FIGS. 1 and 2, the doors (or panels) at the mating ends can be removed to form a longer enclosed aisle, with an interior opening that extends from end-to-end, thus facilitating air flow. In alternate embodiments, one or more of the doors or panels at the mating ends may be left in place.

Data center air routing system 10 is constructed to be relatively air-tight such that the flow of cooled intake air or heated exhaust air can be carefully managed. One aspect of this construction comprises full-height, sidewall blanking panels 31 that are removable from the structure of modular system unit 20 (and 20a), as described below, to allow modular system unit 20 (and 20*a*) to be configured with gaps of varying height and width that can accept IT racks. As shown in FIG. 2, IT racks 71, 72 and 73 are coupled to sidewall 30 of modular system unit 20, and IT racks 271, 272, 273 and 274 are coupled to sidewall 30 of modular system unit 20*a*. In the embodiments shown in FIGS. 1 and 2, sidewall blanking panels 31 can be transparent or translucent to allow ambient light to enter the interior aisle of data center air routing system 10 to assist personnel working inside the aisle. In alternate embodiments, sidewall blanking panels can be opaque, or a combination of transparent, translucent or opaque, as desired. Modular system unit ceiling 50 can also comprise a series of optionally removable ceiling panels, described below, which may also be transparent or translucent such that ambient lighting can penetrate into the interior aisle of data center air routing system 10. In alternate embodiments, the ceiling panels may be opaque, or a combination of transparent, translucent or opaque, as desired.

The data center air routing system of the invention can be used to either route conditioned air into the IT racks, or to route heated exhaust air out from the IT racks and either out of the data center room or to the intake of the air conditioning unit for cooling or recirculation. The airflow into or out of the modular system units 20 and 20*a* is preferably accomplished through the modular system unit ceiling 50 and/or through the floor of the data center room, such as raised floor 12.

The embodiments shown in FIGS. 1 and 2 accomplish air flow through modular system unit ceiling 50, specifically through the use of a ceiling air delivery or exhaust assembly 40. Ceiling air delivery/exhaust assembly 40 comprises one or more air ducts 41. The air ducts 41 can be constructed in varying shapes and sizes, depending on the configuration of the data center room in which the data center air routing system is installed and on the specific use of the data center air routing system. In the embodiments shown in FIGS. 1 and 2, data center air routing system 10 is contemplated to be used in a data center room with a drop or suspended ceiling (not shown) that defines an air plenum for either conditioned air or exhaust air. To accommodate this data center room configuration, air ducts 41 may comprise flexible tubes 45 that can be coupled to a drop or suspended ceiling (not shown), and duct frames 42 that are coupled to modular system unit ceiling 50. The embodiments shown in FIGS. 1 and 2 also contemplate the use of optional transparent or translucent duct sidewalls 43 that contribute to ambient light infiltration into the interior of modular system units 20 and 20*a*. In alternate embodiments, duct sidewalls may be opaque, or a combination of transparent, translucent or opaque, as desired.

Also shown in FIGS. 1 and 2 are optional louvers or baffles 88 located between air duct 41 and the interior aisle of modular system units 20 and 20*a*. Louvers or baffles 88 seal the opening where air duct 41 meets modular system unit ceiling 50, and in a preferred embodiment, are balanced such that louvers or baffles 88 automatically open upon the pressure differential caused by airflow into or out of the air duct 41.

Data center air routing system 10 also provides for the optional routing of cables over the modular system unit 20 (and 20*a*). As shown in FIGS. 1 and 2, cable routing is accomplished by support structure and wire trays 58, which are coupled to the modular system unit duct frames 42 on each side of modular system unit ceiling 50.

FIG. 2 shows the data center air routing system 10 of FIG. 1 with eight IT racks, shown as references 71, 72 and 73 coupled to one side of modular system unit 20 and references 271, 272, 273 and 275 coupled to one side of modular system unit 20*a*, to illustrate one manner in which the system can be used. With further reference to FIG. 2, each of the IT racks includes a top panel, such as top panel 75 of IT rack 71. The IT racks are coupled to the modular system units by removing the appropriate number of sidewall blanking panels 31, and placing either the front or rear sides of the IT rack adjacent to sidewall 30, thus fluidly coupling the IT rack with the interiors of the modular system unit 20 or 20*a*.

In most cases, IT racks are designed to admit conditioned air into the front of the rack and exhaust heated air from the rear of the rack. In this configuration, if the fronts of the IT racks are coupled to sidewall 30 and open to the interior of modular system unit 20, modular system unit 20 accomplishes a cold aisle into which conditioned air enters either through the modular system unit ceiling 50 and ceiling air delivery 40 or through openings in the raised floor 12 on which modular system unit 20 (and 20*a*) sits. In this configuration, heated air would be exhausted through the open rear sides of the IT racks. An alternative is to couple the IT racks to the modular system unit sidewalls 30 such that their rear sides are coupled to sidewall 30 and open to the interior of modular system unit 20, in which case the data center routing system accomplishes an enclosed hot aisle that routes heated exhaust air out of the data center room through exhaust assembly 40.

With further reference to FIG. 2, side-sealing panels 77 may be installed to assist in providing a relatively air-tight seal between the IT racks and the remaining sidewall blanking panels 31. Adjustable blanking panels 76 may also be installed to fill any gaps between IT rack top panel 75 and modular system unit frame edge 78. This construction maintains a relatively airtight coupling of the IT racks to the data cooling air routing system 10.

Figure 3:
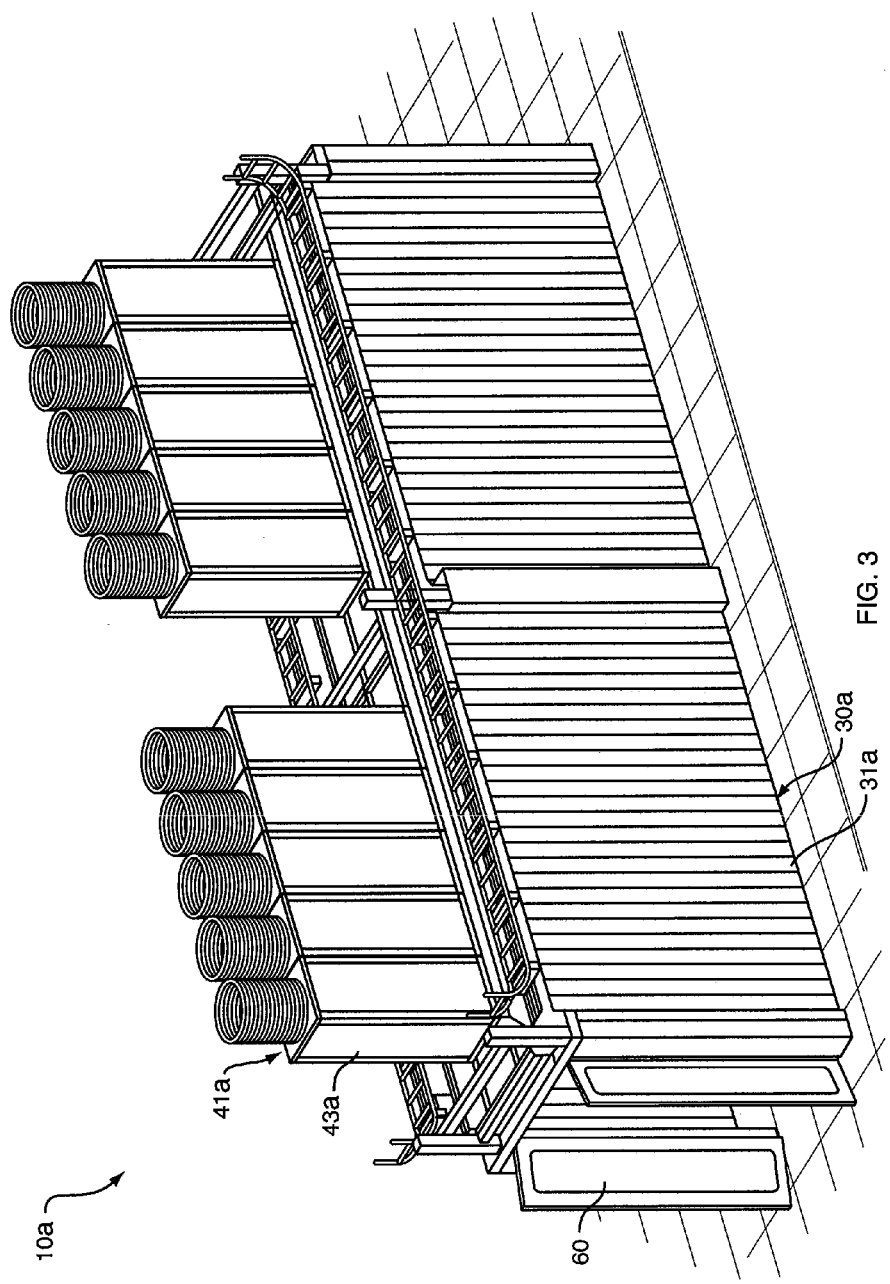
FIG. 3 is a perspective view of a data center air routing system, in accordance with a second preferred embodiment of the invention, comprising two mated modular system units, sidewall blanking panels that do not allow ambient light into the aisles of the modular system units, doors at the each end of the data center air routing system, and ceiling air delivery/exhaust assemblies with duct sidewalls that do not allow ambient light into the aisles of the modular system units.

FIG. 3 shows an alternate embodiment of a data center air routing system 10*a*. The embodiment shown in FIG. 3 is essentially identical to the embodiment shown in FIG. 1, with two differences. First, sidewall blanking panels 31*a* in FIG. 3 are opaque, to inhibit ambient light from penetrating into the interior aisle of the data center air routing system 10*a*. Second, duct sidewalls 43*a* are also opaque, to further inhibit ambient light from penetrating into the interior aisle of the data center air routing system 10*a*. Note that any combination of transparent/translucent and/or opaque sidewall blanking panels and/or duct sidewalls may be used to achieve the desired level of ambient light penetration into the interior aisle of the data center air routing system.

Figure 4:
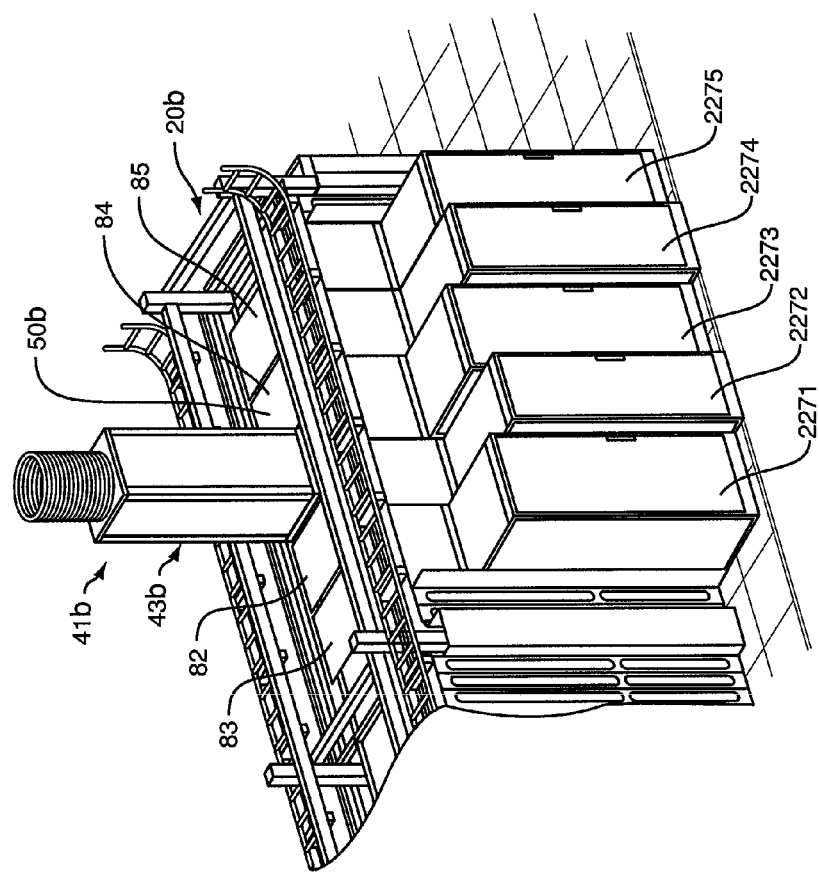
FIG. 4 is a detailed perspective view of a single air duct of a data center air routing system, shown coupled to the ceiling of a modular system unit to which a number of IT racks are coupled.

FIG. 4 shows a single air duct 41*b* of a data center air routing system, shown coupled to the ceiling 50*b* of a modular system unit 20*b* to which a number of IT racks, 2271 through 2275, are coupled. As shown in FIG. 4, modular system unit ceiling 50*b* comprises a number of separately removable ceiling panels 82, 83, 84 and 85. A single air duct 41*b* has been coupled to the modular system unit ceiling 50*b* via the removal of one such ceiling panel. FIG. 4 illustrates one of many possible constructions, and in alternate embodiments, more than one separate air duct, similar to air duct 41*b*, may be coupled to modular system unit ceiling 50*b* to provide airflow sufficient for the particular application. Note that one or more of the ceiling panels 82 through 85 may be transparent or translucent such that ambient lighting can penetrate into the interior aisle of data center air routing system, or opaque to inhibit ambient light from penetrating into the interior aisle of the data center air routing system, or any combination thereof. Similarly, the duct sidewalls 43*b* can be translucent, transparent, or opaque, or any combination thereof.

Figure 5A:
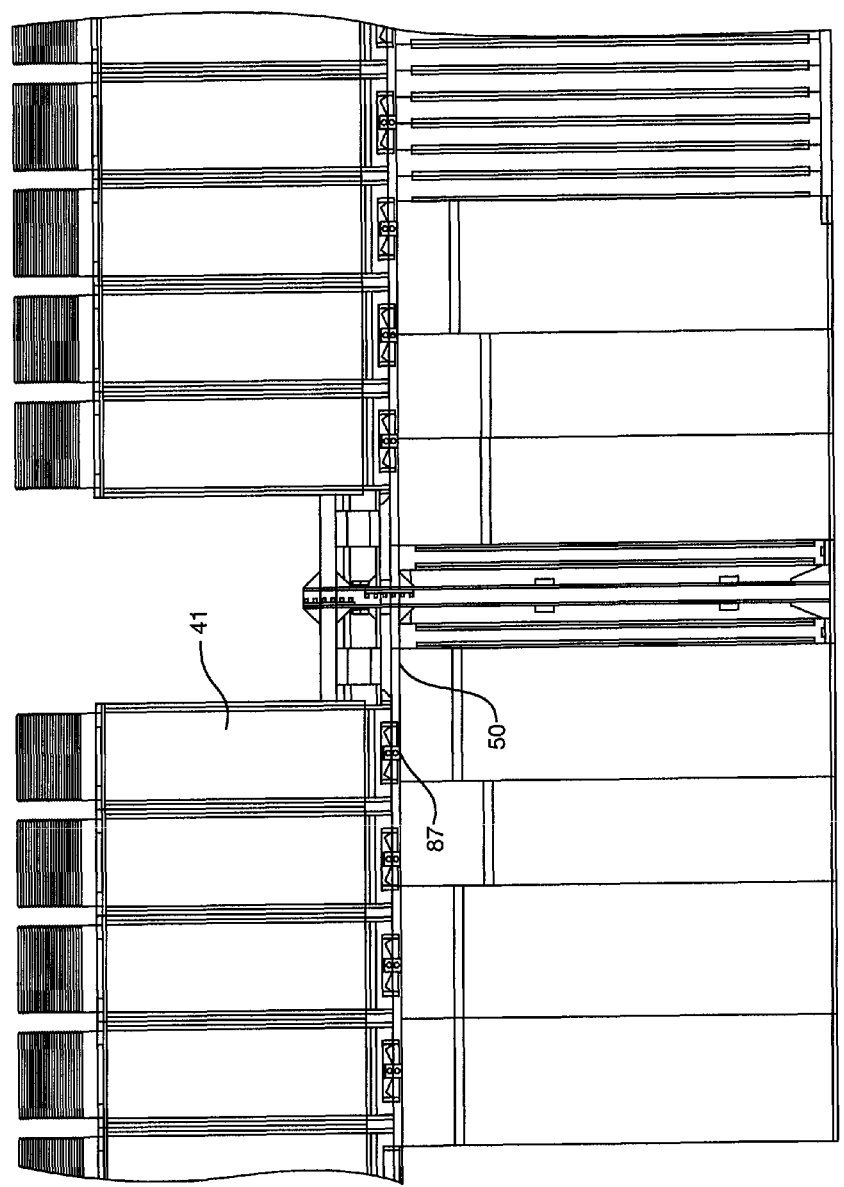
Figure 5B:
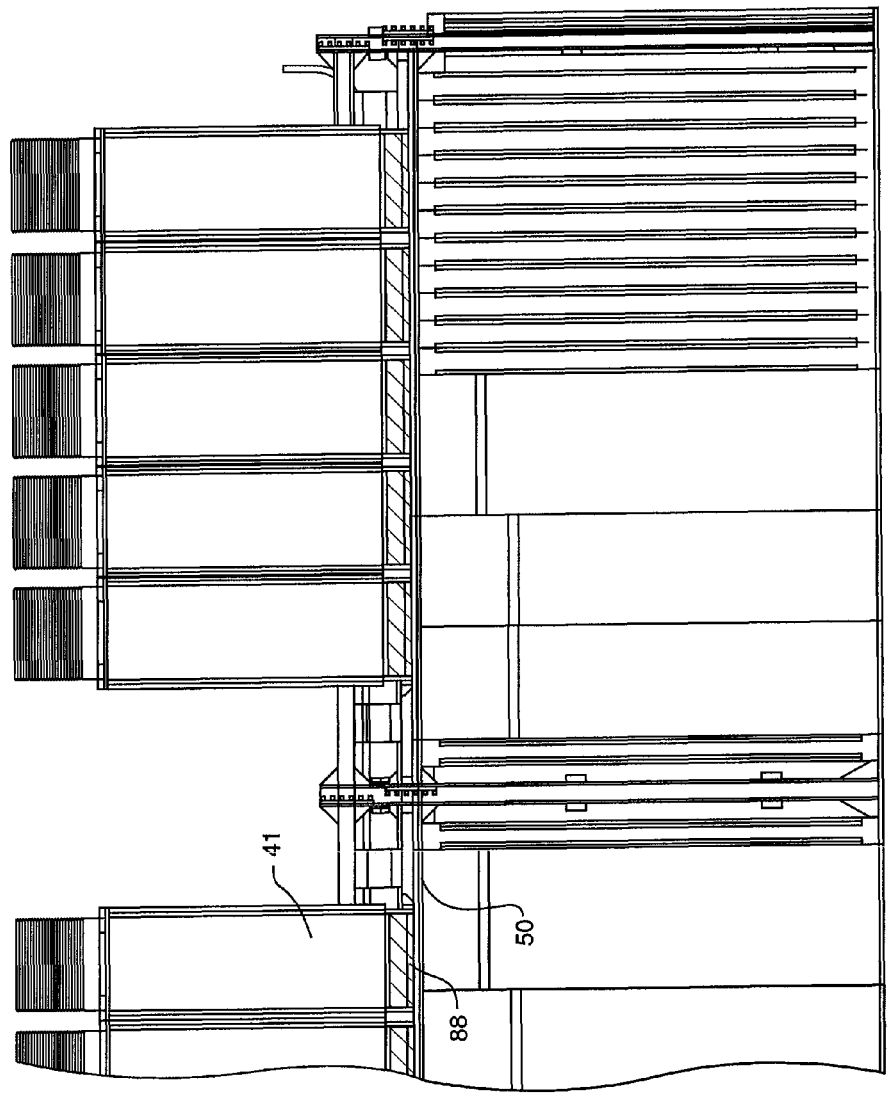

FIGS. 5A, 5B and 5C show three embodiments of air movement systems that may be incorporated into the data center air routing systems of the invention. FIG. 5A is cross-sectional view of a data center air routing system with an active air movement system comprising fan 87 located at the intersection of air duct 41 and modular system unit ceiling 50. FIG. 5B is a cross-sectional view of a data center air routing system showing an alternative air movement system comprising louvers or baffles 88 that open when the air duct 41 is in use and automatically close when the air duct 41 is not in use, in order to prevent air infiltration or egress in the interior aisle of the data center air routing system. FIG. 5C is a cross-sectional view of a data center air routing system with a passive air management system comprising an opening 89 for air inlet/outlet at the intersection of air duct 41 and modular unit ceiling 50.

Figure 6A:
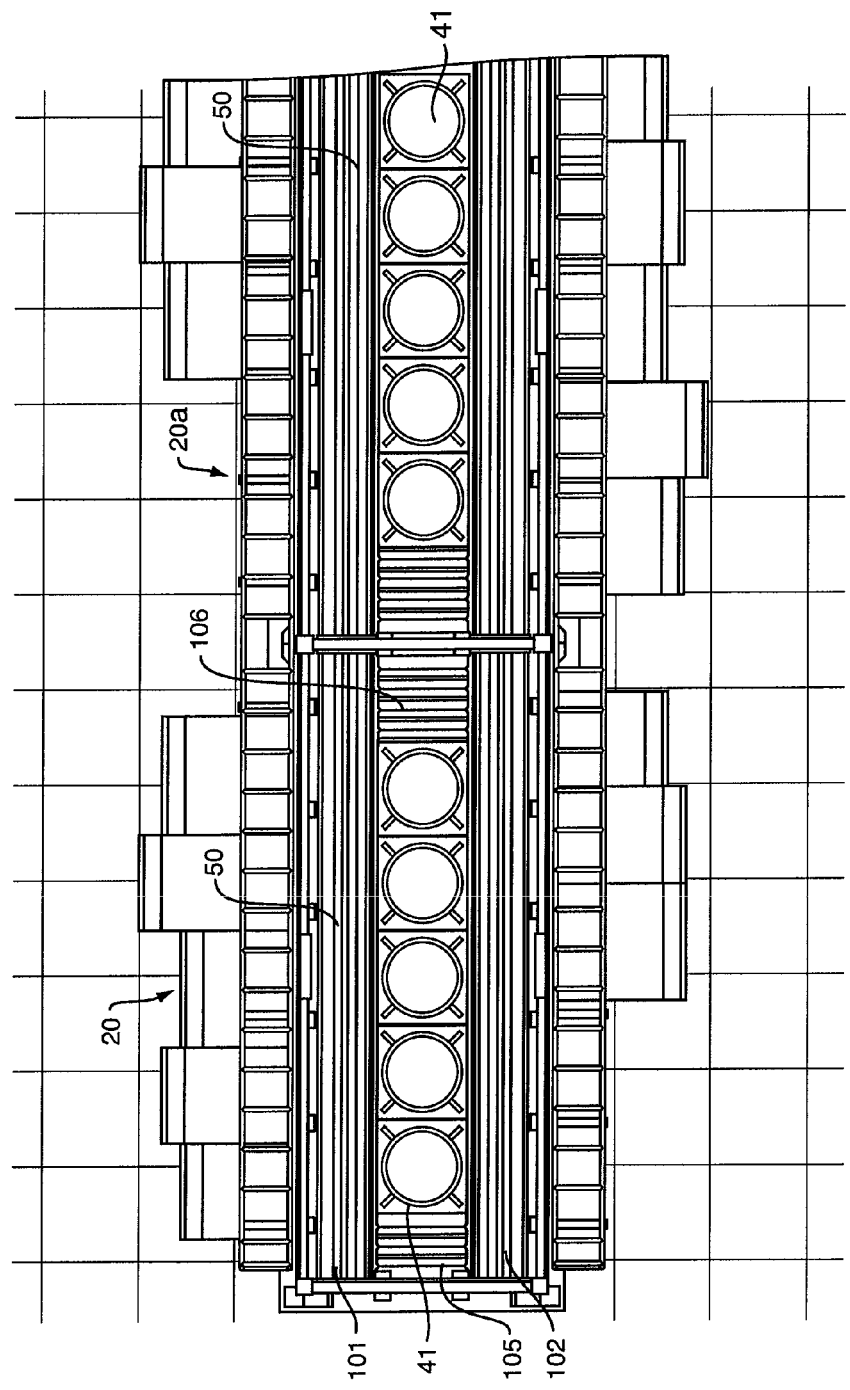
FIG. 6A is a top view of a portion of a data center air routing system comprising two modular system units, with five air ducts coupled to each modular system unit, where the air ducts are centered in the modular system units.
Figure 6B:
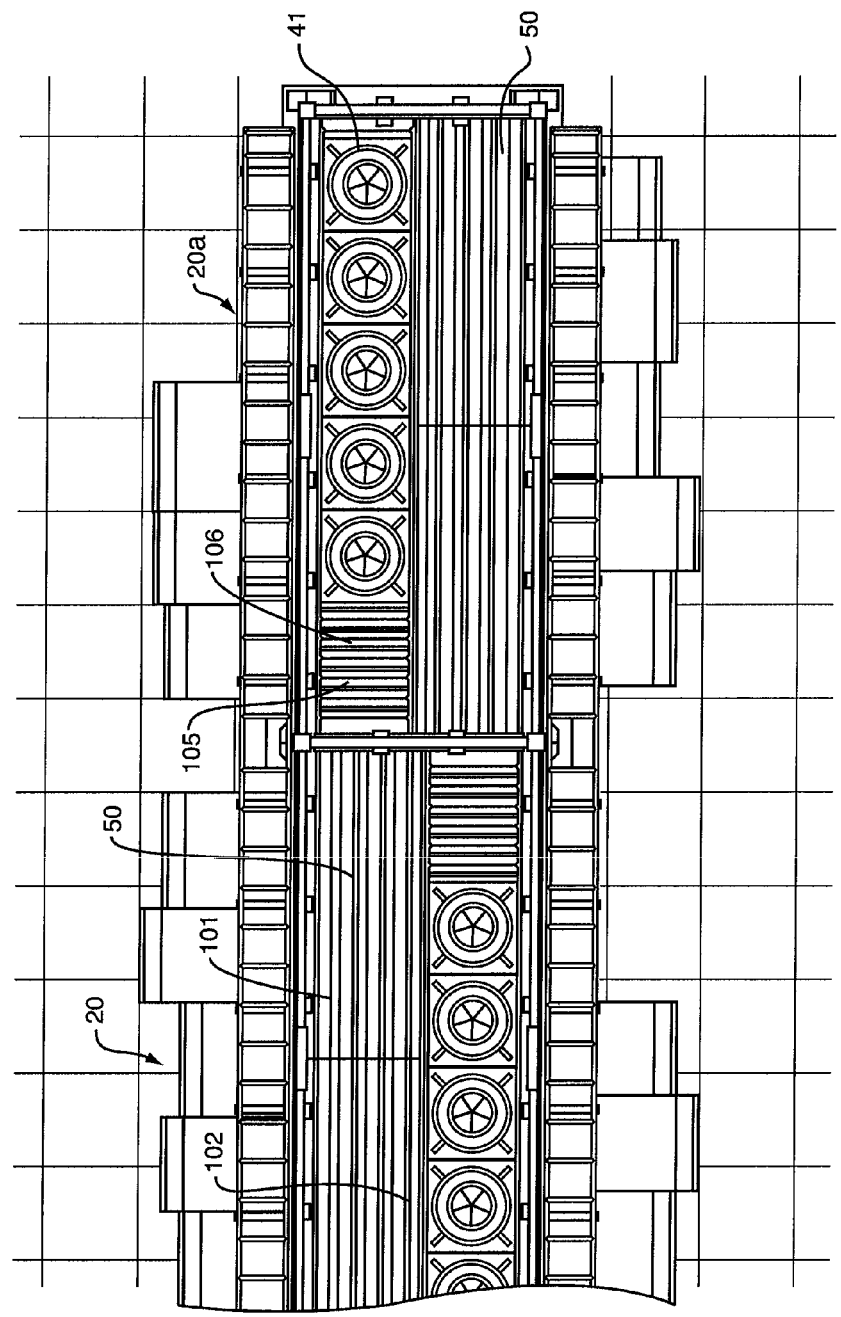
FIG. 6B is top view of a portion of a data center air routing system comprising two modular system units, with five air ducts coupled to each modular system unit, where the air ducts are coupled to one side and at one end of each of the modular system units.

FIGS. 6A and 6B show two different configurations for coupling the ceiling air delivery/exhaust assembly 40, and specifically the air ducts 41 to the modular system unit ceiling 50. With reference to FIG. 6A, air ducts 41 are located in the center of modular system unit ceiling 50 of each of units 20 and 20*a*. Modular system unit ceiling 50 comprises left and right removal panels 101 and 102, and center removable panels 105 and 106. Five air ducts 41 are located between panels 101 and 102.

FIG. 6B shows an alternate arrangement for coupling the ceiling air delivery/exhaust assembly 40 to modular system unit ceiling 50, in which air ducts 41 are located towards one side of each modular system unit 20 and 20*a*. Air ducts 41 are further located adjacent to one another and adjacent to one end of each modular system unit 20 and 20*a*. The configuration shown in FIG. 6B is accomplished by moving ceiling panel 102 such that it abuts ceiling panel 101, and moving ceiling panel 105 such that it abuts ceiling panel 106, thus creating a gap sufficient for coupling air ducts 41 in the open space, as shown.

Figure 7:
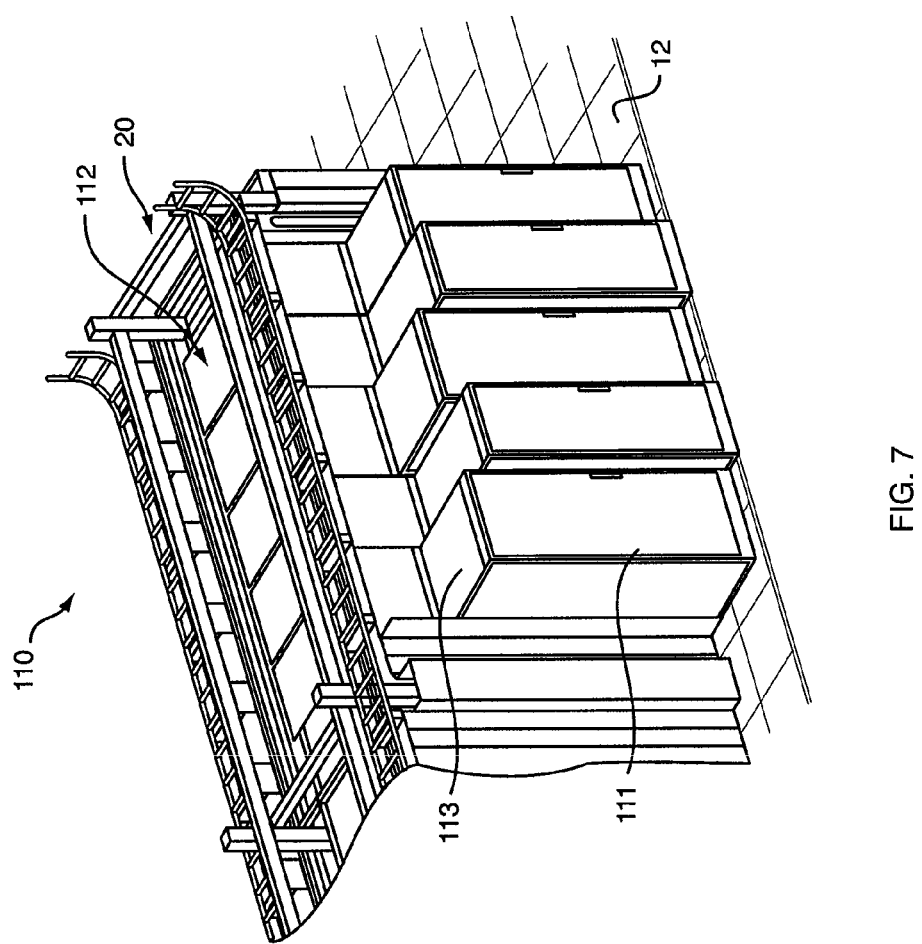
FIG. 7 is a perspective view of a portion of a data center air routing system used as a cold aisle, in which conditioned air is supplied to the interior of the data center air routing system through a raised floor air supply plenum.

FIG. 7 shows an alternative embodiment of data center air routing system 110, adapted to be used as a cold aisle, in which modular system unit ceiling 112 is unbroken, and cold air is admitted into the interior of modular system unit 20 through openings in raised floor 12. The provision of conditioned air from below a raised floor for the use of IT racks is known in the art, thus the floor plenum and the openings are not shown in these drawings. In the embodiment shown in FIG. 7, heated air is exhausted from the rear side of the IT racks, such as rear side 111 of IT rack 113.

Figure 8:
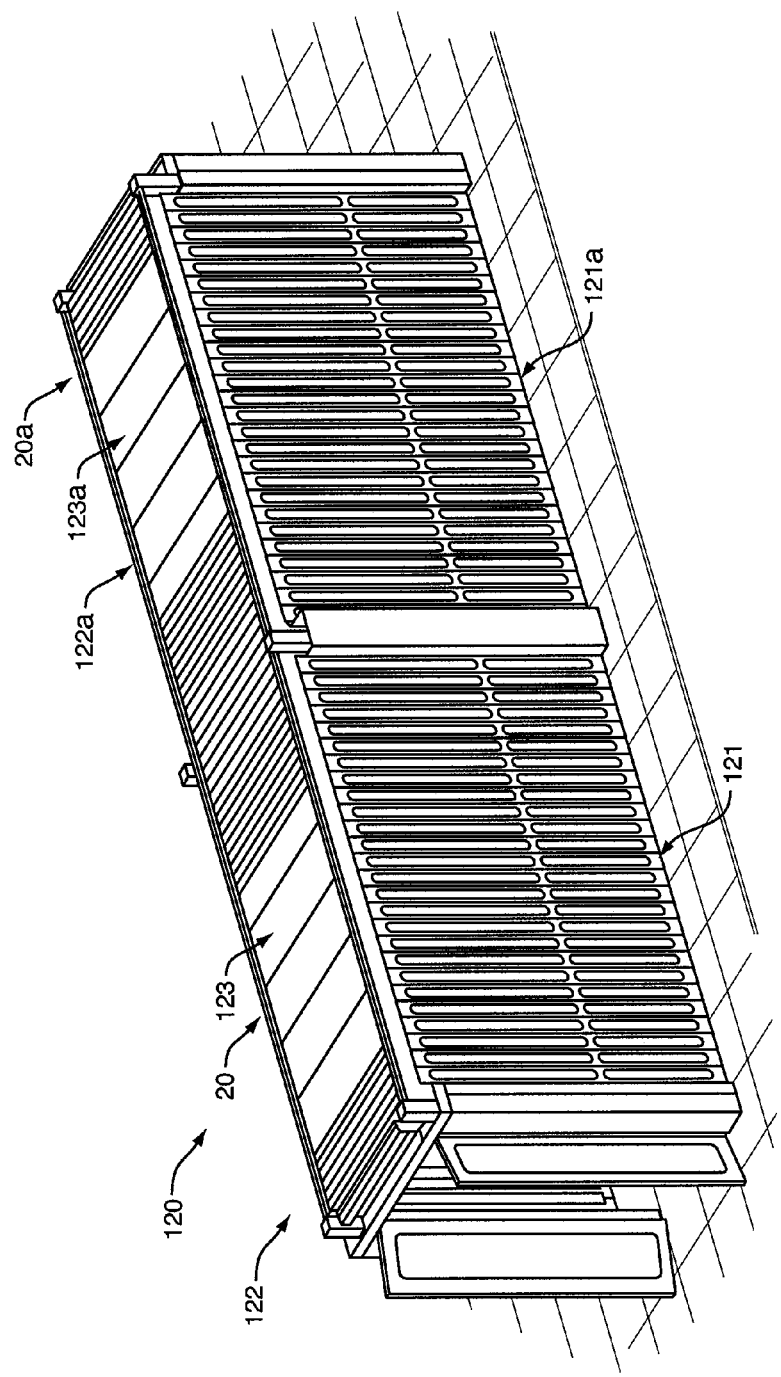
FIG. 8 is a perspective view of an additional preferred embodiment of a data center air routing system.

FIG. 8 shows an alternative embodiment of data center air routing system 120, in which modular system units 20 and 20*a* comprise fixed ceilings 123 and 123*a*, and removable sidewall blanking panels 121 and 122, and 121*a* and 122*b*. Note that ceilings 123 and 123*a*, and/or sidewall blanking panels 121, 122, 121*a* and 122*b* may be translucent, transparent, or opaque, or a combination thereof. If used as a cold aisle, the cooling could be accomplished by an in-row type conditioning unit (not shown) coupled to one of the modular system unit sidewalls 121, 122, 121*a*, or 122*a* in place of an IT rack.

Figure 9A:
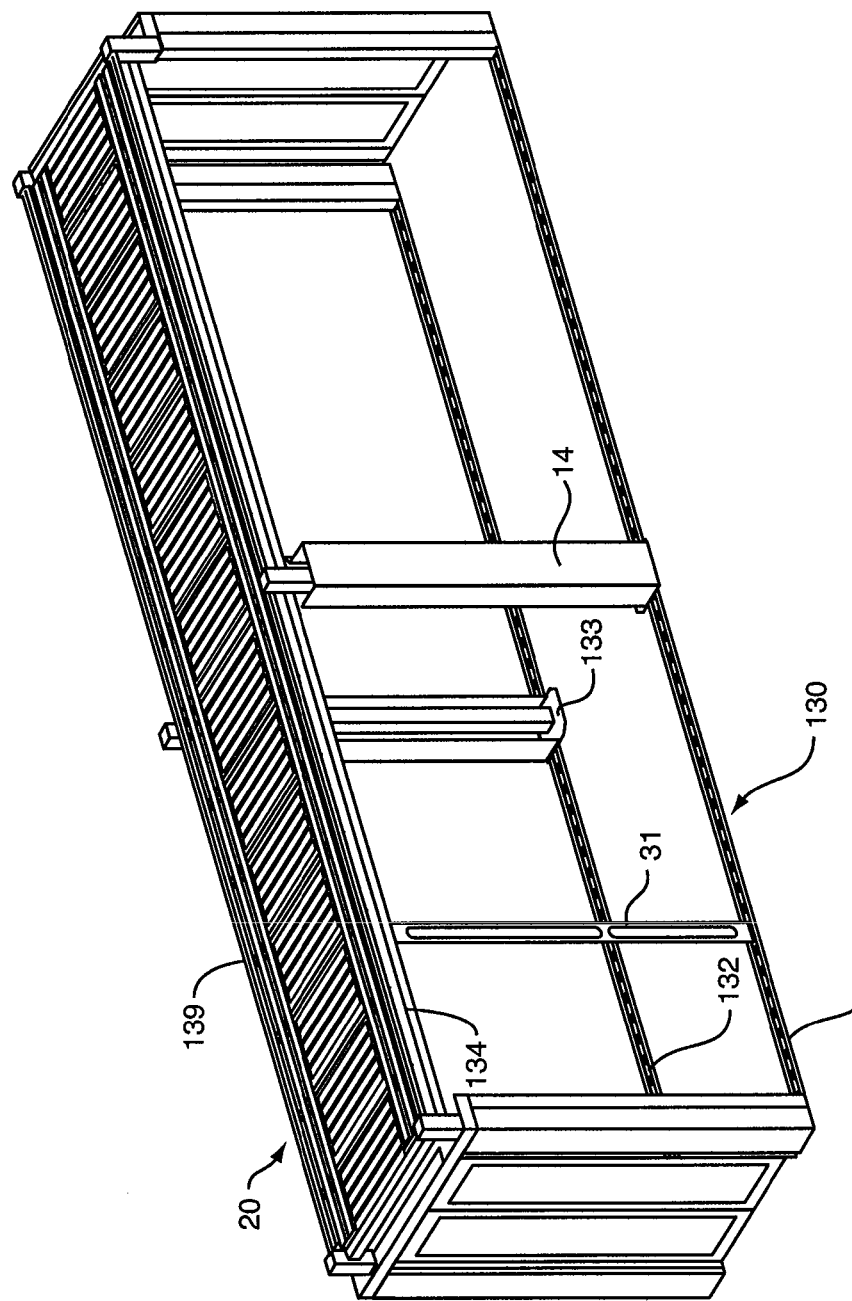
FIG. 9A is a perspective view of a frame of a modular system unit according to a preferred embodiment of the invention.
Figure 9C:
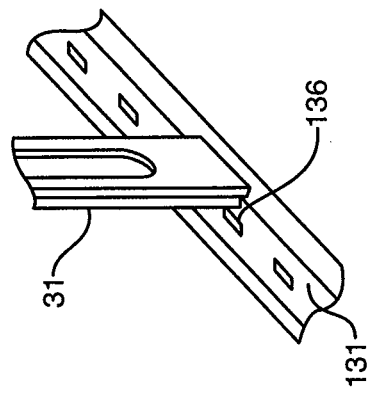
FIGS. 9B and 9C are detailed views of the construction of the frame of FIG. 9A, showing the coupling of sidewall blanking panels to the frame.

FIG. 9A shows a frame 130 for a modular system unit 20. Frame 20 comprises lower horizontal members 131 and 132, and upper horizontal members 134 and 139. Lower horizontal members 131 and 132, and upper horizontal members 134 and 139 are connected at both ends to four vertical support posts 133, one at each of the four corners of the modular system unit 20. Also shown in FIG. 9A is sidewall blanking panel 31. The manner in which sidewall blanking panel 31 is removably coupled to upper horizontal member 134 is shown in FIG. 9B, and the manner in which sidewall blanking panel 31 is removably coupled to lower horizontal member 131 is shown in FIG. 9C.

Figure 9B:
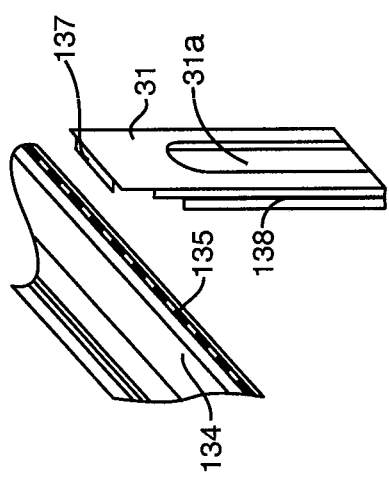

As shown in FIG. 9B, sidewall blanking panel 31 comprises central clear or translucent window or windows 31*a*. Both the left and right sides of sidewall blanking panel 31*a* further define a side flange 138. Side flange 138 is shaped to interlock with a flange of an adjacent sidewall blanking panel 131. The interlocking construction serves to both provide structural integrity and block airflow between two sidewall blanking panels. Sidewall blanking panel 31 carries protruding tab 137 at its top that fits into one of slots 135 in upper horizontal member 134. A similar protruding tab is located on the bottom of sidewall blanking panel 31 (not shown) and is adapted to fit into one of slots 136 in lower horizontal member 131, as shown in FIG. 9C. This construction allows the sidewall blanking panel 31 to be easily connected to and removed from frame 130.

Figure 10:
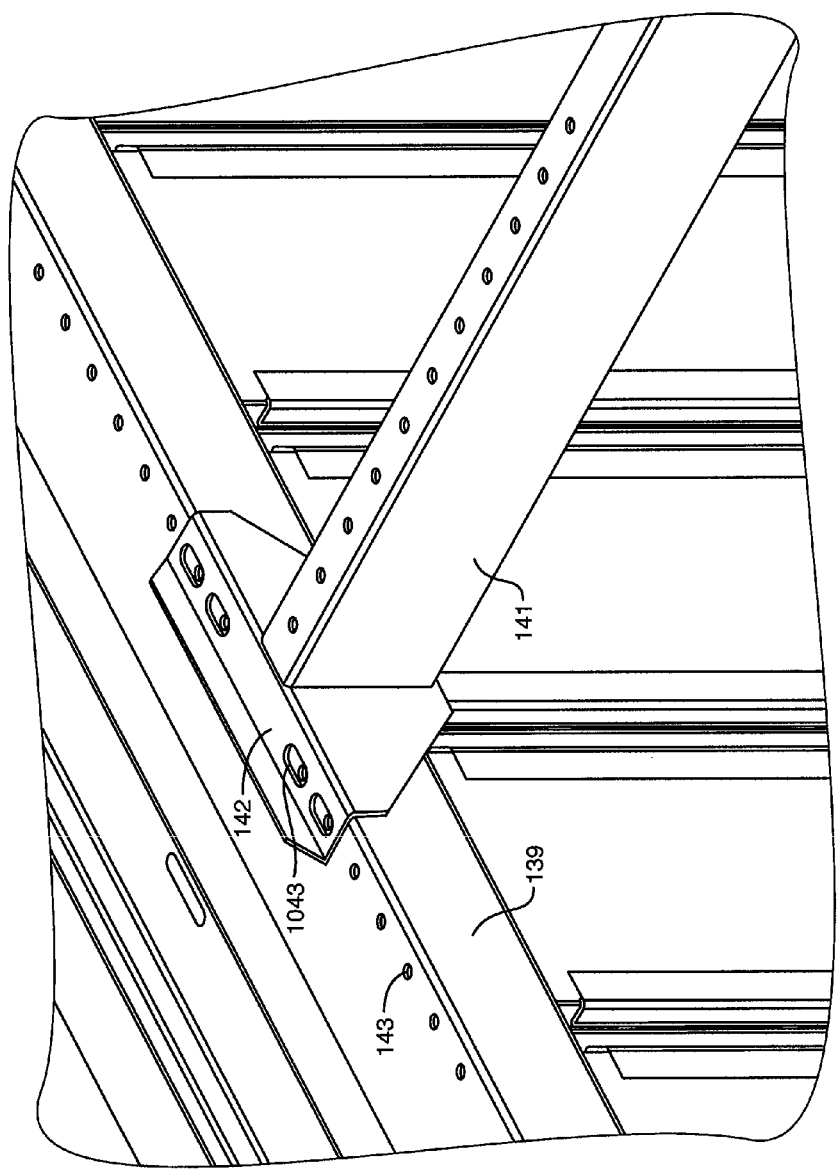
FIG. 10 is an additional detailed view of the construction of the frame of FIG. 9A, showing the coupling of an upper cross member to an upper horizontal member.

FIG. 10 shows a preferred construction of upper cross member 141 and its connection to upper horizontal member 139. Also shown in FIG. 10 is upper cross member 141, which is used to stabilize frame 130. Each upper cross member 141 comprises end flange 142, which includes slots 1043 that allow for variable alignment with the holes 143 along the top edge of upper horizontal member 139. This configuration of slots 1043 and holes 143 allows upper cross members 141 to be easily added, removed or moved as desired.

With further reference to FIGS. 2 and 9A, connector structure 14 is mounted directly onto two adjacent vertical support posts, one each from modular system unit 20 and modular system unit 20*a*. Connector structure 14 acts as an air containment shroud, to assist in providing a relatively air-tight seal between the two modular system units 20 and 20*a*.

Figure 11:
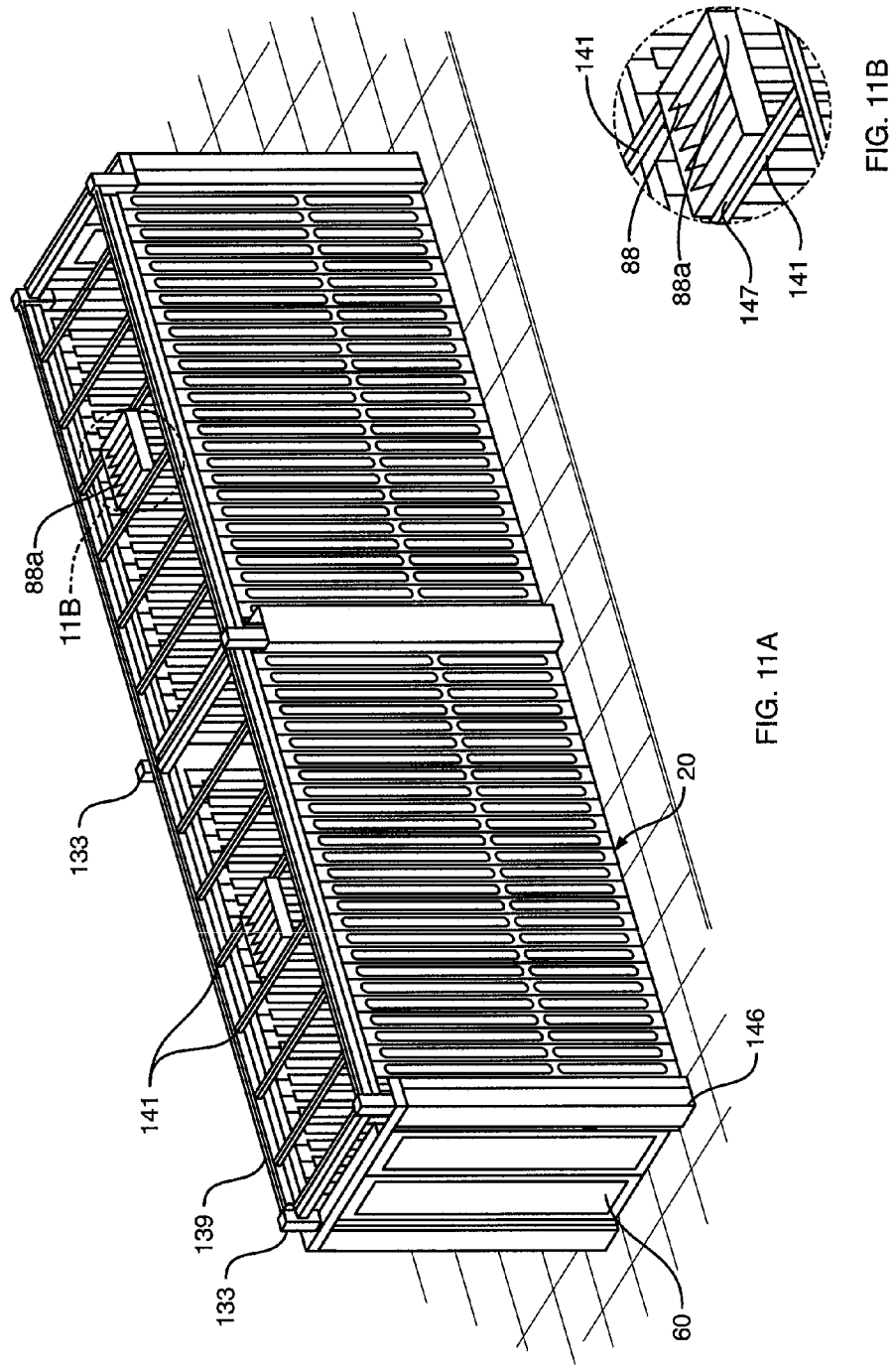
FIGS. 11A and 11B are additional detailed views of the construction of the frame of FIG. 9A, showing the addition of baffles.

As shown in FIGS. 11A and 11B, cross members 141 also allow for the mounting of baffle frame 88*a*, which carries baffles 88. Baffle frame 88*a* comprises one or more flanges 147 that sit on top of and are aligned with openings on the top of cross member 141. The flange/opening combination allows for variable placement of baffle frame 88*a* along the length of cross member 141, such that baffle frame 88*a* may be positioned along the left side, right side or in the center of modular system unit 20. Also shown in FIG. 11A are optional decorative corner pieces 146 that abut door 60 to provide a more finished appearance than would be presented by vertical structural members 133 alone.

Figure 12:
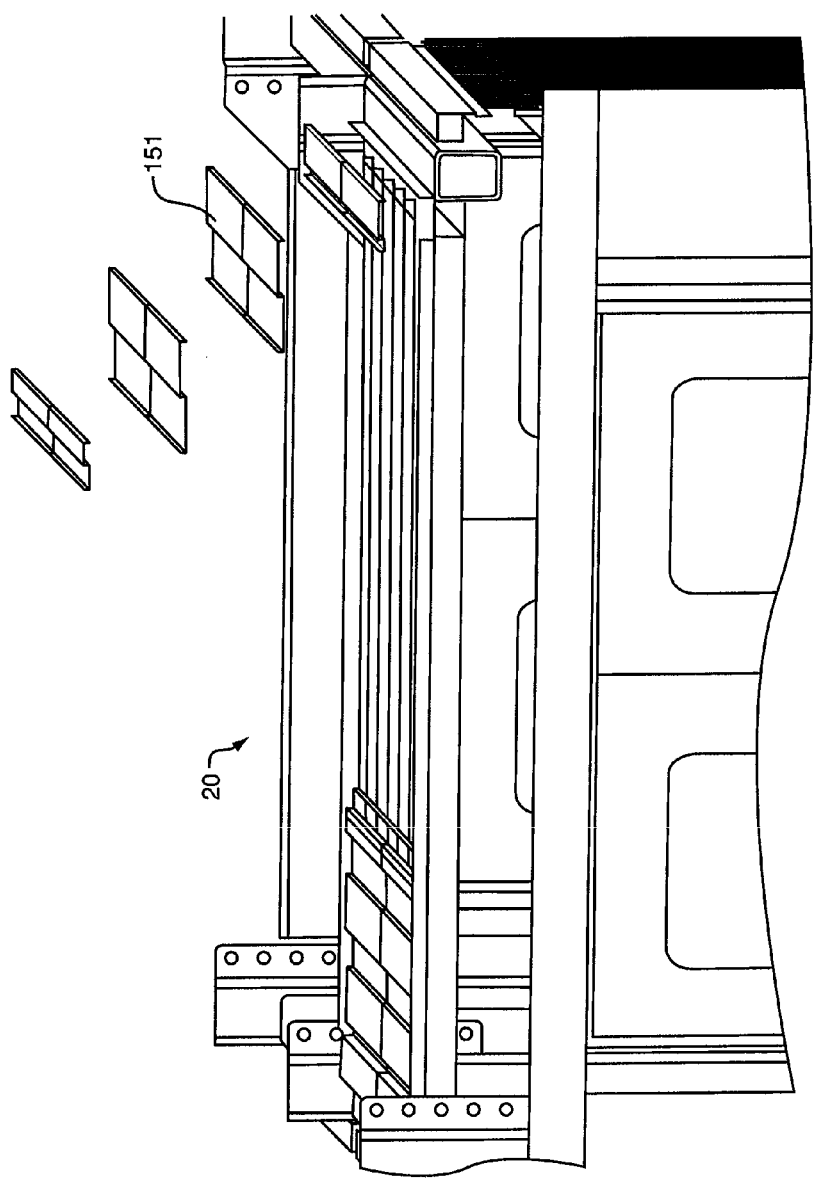
FIG. 12 is a perspective view of a portion of the top of a data center air routing system, showing one manner of coupling ceiling panels or tiles.
Figure 13:
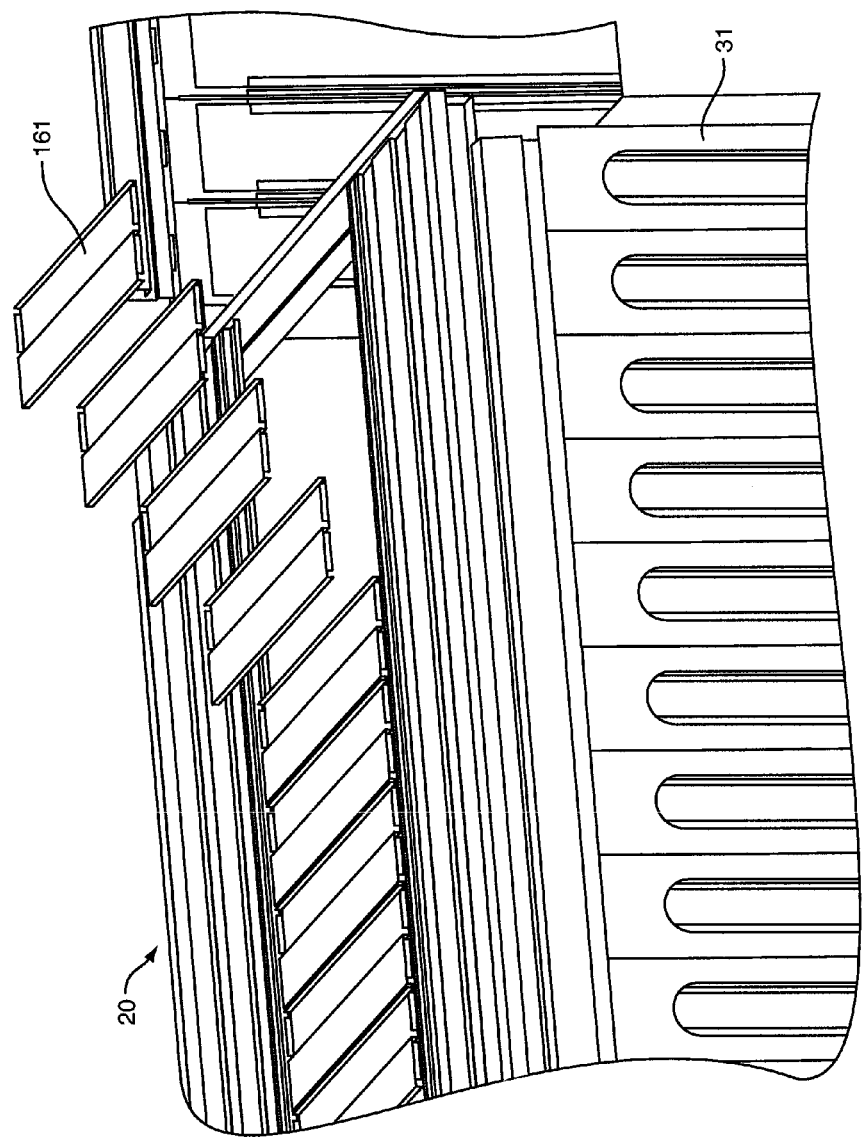
FIG. 13 is a perspective view of a portion of the top of a data center air routing system, showing a second manner of coupling ceiling panels or tiles.

FIGS. 12 and 13 show two possible embodiments of modular system ceiling tiles. In both embodiments, the ceiling tiles are overlapping, interlocking, and individually removable. As shown in FIG. 12, ceiling tiles 151 are gravity-interlocked such that they float or nest upon one another. Specifically, ceiling tiles 151 overlay one another in a manner that allows them to slide toward and away from one another while still remaining overlapped. This particular construction provides a continuous but adjustable modular system unit ceiling that can be adjusted to accommodate the ceiling air ducts.

As shown in FIG. 13, ceiling tiles 161 are laid across the width of the ceiling and also overlap and interlock. Unlike ceiling tiles 151, ceiling tiles 161 are preferably mechanically fastened. In this embodiment, the ceiling ducts can be accommodated by removing the required number of tiles.

The particular construction, materials and dimensions described herein are not limitations of the invention, as other constructions can accomplish the invention described herein.

Although specific features of the invention are shown in some figures and not others, this is for convenience only, as some features may be combined with any or all of the other features in accordance with the invention.

Recitation ranges of values herein are merely intended to serve as a shorthand method of referring individually to each separate value falling within the range, unless otherwise indicated herein, and each separate value is incorporated into the specification as if it were individually recited herein.

The use of any and all examples, or exemplary language (e.g., "such as") provided herein, is intended merely to better illustrate the invention and does not pose a limitation on the scope of the invention.

A variety of modifications to the embodiments described herein will be apparent to those skilled in the art from the disclosure provided herein. Thus, the invention may be embodied in other specific forms without departing from the spirit or essential attributes thereof.

What is claimed is:

1. A data center air routing system, comprising:
   a free-standing structure comprising a generally rectangular frame that defines the edges of two sidewalls, a ceiling and two ends that together define an interior aisle, the frame having four vertical support posts located at each corner of the structure, two upper horizontal members and two lower horizontal members, each horizontal member coupled to two of the vertical support posts, wherein the sidewalls comprise a plurality of full-height sidewall blanking panels, each sidewall blanking panel being removably coupled at a first end to an upper horizontal member of the frame and at a second end to a lower horizontal member of the frame and releasably coupled to an adjacent sidewall blanking panel, so as to allow one or more IT racks to be coupled to either side of the structure, to route air between the structure and the IT racks;
   one or more adjustable blanking panels sized and shaped to fill the space between a top panel of the one or more IT racks and a top edge of the frame;
   wherein the structure is configured to limit air from entering or exiting an interior of the structure;
   a door located at one or both ends, to allow personnel access to the interior aisle;
   wherein each of a left side and a right side of each of the sidewall blanking panels define a side flange, each side flange extending along a longitudinal axis of the corresponding sidewall blanking panel, each side flange being substantially parallel to the vertical support posts of the frame, and each side flange adapted to interlock with an adjacent side flange of an adjacent sidewall blanking panel; and
   wherein each of the sidewall blanking panels define a first protruding tab disposed at the first end of the sidewall blanking panel and a second protruding tab disposed at the second end of the sidewall blanking panel, the first protruding tab and the second protruding tab adapted to fit into corresponding first and second slots defined by the upper horizontal member and the opposing lower horizontal member, respectively.

2. The data center air routing system of claim 1, wherein the frame further comprises one or more upper cross members, where each end of the upper cross member is coupled to one of the upper horizontal members.

3. The data center air routing system of claim 2, further comprising at least one baffle frame comprising one or more baffles, and wherein the baffle frame is adapted to removably couple to at least one of the upper cross members.

4. The data center air routing system of claim 1 wherein the ceiling comprises removable panels.

5. The data center air routing system of claim 4, wherein the removable ceiling panels are configured to interlock with an adjacent ceiling panel.

6. The data center air routing system of claim 4 further comprising an air delivery/exhaust assembly that can be coupled to the structure in place of one or more removed ceiling panels.

7. The data center air routing system of claim 6, further comprising one or more baffles located between the air delivery/exhaust assembly and the interior aisle.

8. The data center air routing system of claim 4 in which at least some of the ceiling panels are transparent or translucent.

9. The data center air routing system of claim 1 in which at least some of the sidewall blanking panels are transparent or translucent.

10. The data center air routing system of claim 1, further comprising one or more side-sealing panels sized and shaped to fill the space between the sides of the one or more IT racks and the adjacent sidewall blanking panel.

11. The data center air routing system of claim 1, further comprising one or more cable trays.

12. A data center air routing system, comprising:
    a free-standing structure comprising a generally rectangular frame that defines the edges of two sidewalls, a ceiling, and two ends that together define an interior aisle;
    where the frame comprises four vertical support posts located at each corner of the structure, and two upper horizontal members and two lower horizontal members, each horizontal member coupled to two of the vertical support posts;
    one or more sidewall blanking panels, each sidewall blanking panel being removably coupled at a first end to an upper horizontal member and at a second end to a lower horizontal member and releasably coupled to an adjacent sidewall blanking panel, so as to allow one or more IT racks to be coupled to either side of the structure;
    wherein each of a left side and a right side of each of the sidewall blanking panels define a side flange, each side flange extending along a longitudinal axis of the corresponding sidewall blanking panel, each side flange being substantially parallel to the vertical support posts of the frame, and each side flange adapted to interlock with an adjacent side flange of an adjacent sidewall blanking panel;
    wherein each of the sidewall blanking panels define a first protruding tab disposed at the first end of the sidewall blanking panel and a second protruding tab disposed at the second end of the sidewall blanking panel, the first protruding tab and the second protruding tab adapted to fit into corresponding first and second slots defined by the upper horizontal member and the opposing lower horizontal member, respectively;
    one or more adjustable blanking panels sized and shaped to fill the space between a top panel of the one or more IT racks and a top edge of the frame; and
    one or more side-sealing panels sized and shaped to fill the space between the sides of the one or more IT racks and the adjacent sidewall blanking panel.

13. The data center air routing system of claim 12, where the ceiling comprises one or more removable panels.

14. The data center air routing system of claim 12, further comprising one or more air delivery/exhaust assemblies.

15. The data center air routing system of claim 12, further comprising one or more baffles.

16. The data center air routing system of claim 12, further comprising one or more cable trays.

17. A data center air routing system comprising:
    two or more free-standing structures, each structure comprising a frame that defines the edges of two sidewalls, a ceiling and two ends that together define an interior space, wherein each of the frames is generally rectangular and comprises four vertical support posts located at each corner of the structure, two upper horizontal members and two lower horizontal members, each horizontal member coupled to two of the vertical support posts;

wherein the sidewalls comprise a plurality of full-height sidewall blanking panels, each sidewall blanking panel being removably coupled at a first end to an upper horizontal member and at a second end to a lower horizontal member and releasably coupled to an adjacent sidewall blanking panel, so as to allow one or more IT racks to be coupled to either side of the structure, to route air between the structure and the IT racks;

one or more adjustable blanking panels sized and shaped to fill the space between a top panel of the one or more IT racks and a top edge of the frame;

one or more side-sealing panels sized and shaped to fill the space between the sides of the one or more IT racks and the adjacent sidewall blanking panel;

where the interior spaces of each of the structures are open to each other to form an interior aisle that extends through the length of both structures;

wherein the system is configured to limit air from entering or exiting an interior of the system;

wherein each of a left side and a right side of each of the sidewall blanking panels define a side flange, each side flange extending along a longitudinal axis of the corresponding sidewall blanking panel, each side flange being substantially parallel to the vertical support posts of the frame, and each side flange adapted to interlock with an adjacent side flange of one of the adjacent sidewall blanking panels; and wherein each of the sidewall blanking panels defines a first protruding tab disposed at the first end of the sidewall blanking panel and a second protruding tab disposed at the second end of the sidewall blanking panel, the first protruding tab and the second protruding tab adapted to fit into corresponding first and second slots defined by the upper horizontal member and the lower horizontal member, respectively.

18. The data center air routing system of claim 17, further comprising a door located at one or both ends of the interior aisle, to allow personnel access to the interior aisle, and inhibit unwanted air flow.

19. The data center air routing system of claim 17, wherein each of the frames further comprise one or more upper cross members, where each end of the upper cross member is coupled to one of the upper horizontal members.

* * * * *